(12) United States Patent
Bouvier et al.

(10) Patent No.: US 12,527,011 B2
(45) Date of Patent: Jan. 13, 2026

(54) 3D CAPACITORS

(71) Applicant: Murata Manufacturing Co., Ltd., Nagaokakyo (JP)

(72) Inventors: Stéphane Bouvier, Cairon (FR); Sébastien Iochem, Caen (FR); David Denis, Bayeux (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 549 days.

(21) Appl. No.: 17/656,510

(22) Filed: Mar. 25, 2022

(65) Prior Publication Data

US 2022/0216350 A1 Jul. 7, 2022

Related U.S. Application Data

(63) Continuation of application No. PCT/IB2020/059053, filed on Sep. 28, 2020.

(30) Foreign Application Priority Data

Oct. 1, 2019 (EP) .................................... 19306249

(51) Int. Cl.
*H10D 1/66* (2025.01)
*H10D 1/00* (2025.01)
*H10D 1/68* (2025.01)

(52) U.S. Cl.
CPC ............ *H10D 1/665* (2025.01); *H10D 1/047* (2025.01); *H10D 1/696* (2025.01); *H10D 1/714* (2025.01)

(58) Field of Classification Search
None
See application file for complete search history.

(56) References Cited

U.S. PATENT DOCUMENTS

| 2012/0012982 A1* | 1/2012 | Korec | H10D 86/85 |
| | | | 257/E21.598 |
| 2013/0175666 A1* | 7/2013 | Tran | H10D 1/68 |
| | | | 257/532 |
| 2015/0076657 A1 | 3/2015 | Chou et al. | |

(Continued)

OTHER PUBLICATIONS

International Search Report issued for PCT/IB2020/059053, date of mailing Dec. 15, 2020.

(Continued)

*Primary Examiner* — Xiaoming Liu
(74) *Attorney, Agent, or Firm* — ArentFox Schiff LLP

(57) ABSTRACT

A three-dimensional capacitor component that includes a substrate having a textured (contoured) surface and a stack of layers formed conformally over the textured surface to constitute a capacitive stack structure. Respective contacts to the bottom and top electrodes of the capacitive stack structure are both provided at a first side of the component. The bottom electrode and substrate are doped with dopants of the same polarity, and the substrate is heavily doped so that current between a terminal portion of the bottom electrode and remote parts of the bottom electrode flows via the substrate, lowering ESR. A backside metallization layer produces a further, and greater, reduction in ESR. The capacitor component may be implemented as a discrete capacitor component, but may also be integrated with other components/devices. Corresponding fabrication methods are described.

7 Claims, 4 Drawing Sheets

(56) References Cited

U.S. PATENT DOCUMENTS

2016/0087030 A1\* 3/2016 Robutel .................. H03H 1/00
438/387
2020/0091063 A1\* 3/2020 Chen ..................... H01L 25/162

OTHER PUBLICATIONS

Written Opinion of the International Searching Authority issued for PCT/IB2020/059053, date of mailing Dec. 15, 2020.
European Search Report issued for corresponding EP Application No. 19 30 6249, date of completion of search report Feb. 25, 2020.

\* cited by examiner

3D CAPACITORS

CROSS REFERENCE TO RELATED APPLICATIONS

The present application is a continuation of International application No. PCT/IB2020/059053, filed Sep. 28, 2020, which claims priority to European Patent Application No. 19306249.4, filed Oct. 1, 2019, the entire contents of each of which are incorporated herein by reference.

FIELD OF THE INVENTION

The present invention relates to improved capacitor structures and their fabrication methods. More particularly, the invention relates to improved 3D capacitors that have contacts, to the bottom and top capacitor electrodes, that are disposed at the same side of the component, and to their fabrication methods.

TECHNICAL BACKGROUND

So-called three-dimensional capacitors have been developed in view of increasing the capacitance available for a given "footprint" of the capacitor component. In a 3D capacitor, the usual parallel planar plates that are used in a traditional 2D capacitor are replaced by conductive layers which are shaped in three dimensions, typically by forming the conductive and insulating layers in a stack which extends conformally over a textured (contoured) surface. For example, the layers of the capacitive stack may be formed to extend conformally over a set of adjacent blind holes in a substrate. 3D capacitors of the latter kind are commonly referred to as "trench capacitors", even in the case where the blind holes in the substrate are holes having circular or square cross-section rather than a cross-sectional shape that takes an elongated linear form. As an alternative, the layers of the capacitive stack may be formed to extend conformally over a set of adjacent columns provided on a substrate.

In the following description the conductive layers in a capacitive stack will be referred to as "electrode" layers irrespective of whether a contact has been formed to the relevant layer. In addition to 3-layer stacks (electrode-insulator-electrode: EIE), capacitive stacks having repeating layered structures may be used (e.g. EIEIE; EIEIEIE, and so on) depending on the space available. Such structures are often referred to as MIM (or MIMIM, etc.) stacks, or MIM capacitors.

For some applications it is desirable to be able to make contact to the top and bottom electrodes of a 3D capacitor component on the same side of the capacitor component, for example in a case where a 3D capacitor component is designed to be flip-chip bonded to a mounting substrate. 3D capacitor components that have contacts connecting to the top and bottom electrodes on a common side of the component may be called "horizontal" capacitor components (as opposed to "vertical" capacitor components which have a contact to the bottom electrode on one side of the component and a contact to the top electrode on the opposite side of the component in the thickness direction of the component). FIG. 1A illustrates a "horizontal" 3D capacitor component. In the example illustrated in FIG. 1A, a 3D capacitor component 1 is flip-chip bonded to a mounting substrate 2.

In the example illustrated in FIG. 1A, the 3D capacitor component 1 comprises a substrate 3 in which a 3D capacitive stack 5 is formed. The substrate 3 may be, for example, a $p^+$ doped silicon substrate. In the example illustrated in FIG. 1A, the bottom electrode 6 of the capacitive stack 5 is formed by a doped region in the substrate 3. The doped region 6 may be, for example, $n^+$ doped silicon In the example illustrated in FIG. 1A, the texture in the substrate 3 takes the form of blind holes of approximately circular cross-section which extend from a first surface 3a of the substrate 3 into the bulk of the substrate and end within the doped region 6. However, the textured surface may take other forms (e.g. elongated trenches, columns, etc.). A continuous insulator layer 7 lines the walls of the holes and constitutes the dielectric of the 3D capacitor. The top electrode of the 3D capacitor is formed by a conductive layer 8 which fills the holes and has, at the surface 3a of the substrate, an elongate or plate-shaped portion 8c which acts as a current collector. The bottom electrode 6 comprises a terminal portion 6r which extends along the surface 3a of the substrate.

In the example illustrated in FIG. 1A, there is a metal contact pad 11 formed on the terminal portion 6r of the bottom electrode and a metal contact pad 12 formed on the current collector portion 8c of the top electrode. Bonding bumps 15 connect the contact pads 11, 12 to conductors 21, 22 on the mounting substrate 2.

In 3D capacitors, typically the electrode layers in the capacitive stack are made of material having high resistivity, for example polysilicon, doped silicon, a thin layer of TiN, etc., and this has the disadvantage that it leads to intrinsic high parasitic equivalent series resistance (ESR). This problem is exacerbated in the case where it is desired to make a thin component, such that the electrode layers in the capacitor become particularly thin. For vertical 3D capacitors the ESR problem may be tackled by providing a sheet of highly-conductive metal in contact with the top electrode and by short-circuiting the bottom electrode using, for example, the ground plane of a PCB on which the capacitor component is mounted. However, this approach is not available for horizontal 3D capacitors.

For horizontal 3D capacitors, it is possible to provide a plate of highly-conductive material, e.g. Al, Cu, in contact with the top electrode, e.g. by providing a metal contact pad 12 in contact with the current collector portion 8c of the top electrode and, as a result, the top electrode does not make a significant contribution to the overall ESR of the capacitor structure. However, even if a plate of highly conductive material (e.g. a metal contact pad 11 in FIG. 1A) is provided in contact with the terminal portion 6r of the bottom electrode, charges travelling between the terminal portion 6r of the bottom electrode and other parts of the bottom electrode (e.g. parts at the center and right-hand side of bottom electrode 6 in FIG. 1A) must still travel a relatively long distance over a high-resistivity path. Thus, there is a limit in the reduction in ESR that can be achieved.

One approach to tackle this problem in a 3D horizontal capacitor would be to provide additional contacts to the bottom electrode layer 6, by forming conductors in multiple vias traversing the top electrode 8 and the insulator layer 7. FIG. 1B illustrates this scenario.

As can be seen in FIG. 1B, in this example configuration the capacitor component 51 has a multi-layer contact structure 61 connected to the terminal portion 6r of the bottom electrode. The multi-layer contact structure 61 includes an elongated contact plate 61a which has a portion that extends underneath the central and right-hand parts of the bottom electrode 6 of the capacitive stack 5.

In the example illustrated in FIG. 1B the multi-layer contact structure 61 also includes an intermediate plate portion 61b and via-hole conductors 61c, 61d which interconnect the terminal portion 6r of the bottom electrode to the elongated contact plate 61a. Similarly, in this example, the capacitor component 51 has a multi-layer contact structure 62 connected to the top electrode 8, and the multi-layer contact structure 62 includes a first plate portion 62a formed on the current-collector portion 8c of the top electrode and a second plate portion 62b for connection to the bonding bump 15. Via-hole conductors 62c interconnect the first and second plate portions 62a, 62b. The via-hole conductors 61c and 61d provide multiple parallel current paths between the terminal portion 6r of the bottom electrode and the left-hand bonding bump 15 connecting to the external circuit on the mounting substrate 2. Likewise, the via-hole conductors 62c provide multiple parallel current paths between the current collector portion 8c of the top electrode and the right-hand bonding bump 15 connecting to the external circuit.

Insulating material 65 is interposed between the elongated contact plate 61a that is connected to the bottom electrode 6 and the first plate portion 62a that is connected to the top electrode 8. The via-hole conductors 61c, 61d, 62c likewise pass through insulating material.

Multiple via-hole conductors 64 pass through the current collector portion 8c of the top electrode and connect the elongated contact plate 61a to multiple positions along the bottom electrode 6. Thus, charge transport is improved between the central/right-hand parts of the bottom electrode 6 and the contact structure 61 that connects the bottom electrode 6 to the external circuit on the mounting substrate 2.

It has been demonstrated that the overall ESR of the capacitor component can be reduced by increasing the number of vias 64. However, there are practical limits on the number of via-hole contacts that can be formed through the current collector portion of the top electrode. More particularly, to achieve a very low ESR it would be necessary to form a very dense matrix of vias (contacts) and production of such a dense matrix would require use of advanced, high-resolution photolithographic equipment or the like, which increases the cost of the fabrication process. Moreover, in the case where a dense matrix of vias is formed the probability of manufacturing defects increases. Finally, in order to produce a dense matrix of contacts it may prove necessary to alter the shape of the textured substrate surface upon which the capacitive stack is formed, for example in order to avoid having a trench in a location where it would be contacted by a via-hole conductor. However, if the number of trenches/holes is reduced then this tends to lower the overall capacitance of the capacitor component.

The present invention has been made in the light of the problems discussed above.

SUMMARY OF THE INVENTION

In 3D capacitor components according to embodiments of the invention, wherein contact to the bottom electrode is made via a terminal portion, namely a terminal portion provided at one end of the bottom electrode layer, charge transport is promoted by providing an additional charge flow path. The additional charge flow path passes through the substrate. More specifically, the nature and concentration of dopants in the bottom electrode and in the substrate are controlled to promote charge transport between the terminal portion and the rest of the bottom electrode via the substrate.

The present invention provides a capacitor structure comprising: a substrate;
a stack of layers formed, conformally, over a set of adjacent blind holes in the substrate, or over a set of adjacent columns provided on the substrate, to constitute an electrode-insulator-electrode stack, the electrode-insulator-electrode stack including a bottom electrode and a top electrode; wherein: the top electrode of the electrode-insulator-electrode stack has an elongate portion extending along the surface at a first side of the substrate, the first side of the substrate being the side where the mouths of the blind holes, or the tops of the columns, are formed, the bottom electrode of the electrode-insulator-electrode stack has a terminal portion extending along the surface at said first side of the substrate, and a contact connecting to the top electrode and a contact connecting to the bottom electrode are provided at said first side of the substrate; characterized in that the substrate and the bottom electrode of the electrode-insulator-electrode stack are doped by dopants having the same polarity, and the concentration of dopants in the substrate is $1 \times 10^{18}/cm^3$ or greater, creating a current flow path through the substrate between the terminal portion of the bottom electrode and portions of the bottom electrode remote from said terminal portion.

Because the substrate is heavily doped with dopants of the same polarity as those in the bottom electrode, an additional charge-transport path is provided between the terminal portion and the rest of the bottom electrode. Indeed, resistivity is reduced as if the thickness of the bottom electrode has been increased by addition of the thickness of the substrate. Thus electric charges in portions of the bottom electrode that are remote from the terminal portion are not obliged to travel all the way along the high-resistivity material forming the bottom electrode in order to reach the terminal portion of the bottom electrode, but can find a lower-resistance path via the substrate (and the same applies for charge transport in the opposite direction, i.e. from the terminal portion towards the rest of the bottom electrode). Accordingly, a reduction in ESR can be obtained in a horizontal 3D capacitor structure by a technique other than employing a dense matrix of via-hole conductors traversing the top electrode. Of course, if desired, some via-hole conductors traversing the top electrode can be provided so as to provide yet another current path between points on the bottom electrode and the contacts used to connect the capacitor structure to an external circuit.

In some embodiments of the invention the electrode-insulator-electrode stack comprises a laminated structure including at least one intermediate electrode layer between the bottom electrode and top electrode layers, and insulating material interposed between adjacent electrode layers of the stack. So, the capacitive stack structure may be a repeating laminated structure such as an EIEIE structure, an EIEIEIE structure, and so on. It may be necessary to provide a contact to an intermediate electrode layer disposed between the top and bottom electrodes. In such a case, a set of via-hole conductors may be provided traversing the elongate portion of the top electrode, and a contact plate may be provided to connect an external circuit to an intermediate electrode of the stack, wherein the via-hole conductors connect multiple points on the intermediate electrode to said contact plate. In such a case, although contacts traversing the top electrode are present, these connect to the electrode that makes the highest contribution to the overall resistance, and low ESR is still achieved.

The 3D capacitor structure may be configured as a discrete component, in which case this capacitor component is a discrete, low ESR horizontal capacitor.

In some applications, the 3D capacitor structure could be co-integrated into a substrate that also contains other components. However, when designing the overall circuit it must be taken into account that one electrode of the 3D capacitor is connected electrically to the substrate.

In certain embodiments of the invention, charge transport between the terminal portion and the rest of the bottom electrode is promoted by providing a backside metallization layer on the surface of the substrate that is remote from the contacts to the top and bottom electrodes, i.e. on the surface that is remote from the component's surface that is configured for mounting on a mounting substrate. Providing a backside metallization layer of this type has a significant effect in achieving low ESR—indeed, this effect is greater than the effect produced by enabling current flow through the substrate between the terminal portion of the bottom electrode and portions of the bottom electrode remote from said terminal portion. Moreover, in the case where the backside metallization is provided, a shielding effect can be obtained by connecting this metallization layer to a low impedance signal line (e.g. ground).

Backside metallization is often provided on the bottom surface of semiconductor chips in order to facilitate mounting of the chip to a mounting substrate with the backside metallization contacting the mounting substrate. Accordingly, the material(s) used for such conventional backside metallization tend to be selected in view of enabling the chip to be connected to the mounting substrate by soldering. So, in general, materials are selected to have properties (thermal conductivity, coefficient of thermal expansion, solderablity) that enable them to withstand the soldering conditions and promote good connection between the chip and the mounting substrate. Typically, conventional backside metallization is made of a stack of layers, e.g. Ti—Ni—Au, or Ti—Pt—Au, or Ti—Ni—Ag, or Ti—Au.

In contrast, the metallization layer that is used in embodiments of the invention does not need to be designed for facilitating connection to a mounting substrate, and the usual constraints (e.g. regarding solderability and heat dissipation) do not apply. Indeed, the capacitor structure is configured to be mounted on a mounting substrate in an orientation wherein the surface on the first side of the substrate (i.e. the surface where contact can be made to the top and bottom electrodes) faces the mounting substrate and the metallization layer faces away from the mounting substrate. Thus, the same kinds of materials can be selected for use as the metallization layer in the invention as are used on the frontside of the component. In particular, materials whose sheet resistance is significantly lower than the sheet resistance of the substrate may be used to form the metallization layer that is used in embodiments of the invention. Examples of such materials include a layer of Al, or a layer of Cu.

The present invention further provides a method of fabricating a capacitor component, comprising: forming texture in a surface of a substrate, the texture comprising a set of adjacent blind holes or a set of adjacent columns; forming a stack of layers conformally over a set of adjacent blind holes in the substrate, or over a set of adjacent columns provided on the substrate, to constitute an electrode-insulator-electrode stack including a bottom electrode and a top electrode, wherein the top electrode of the electrode-insulator-electrode stack has an elongate portion extending along the surface at a first side of the substrate, the first side of the substrate being the side where the mouths of the blind holes, or the tops of the columns, are formed, and the bottom electrode of the electrode-insulator-electrode stack has a terminal portion extending along the surface at said first side of the substrate, forming, at said first side of the substrate, a contact connecting to the top electrode and a contact connecting to the bottom electrode; characterized in that the forming of texture forms a set of adjacent blind holes or columns in a doped substrate, the forming of the electrode-insulator-electrode stack forms the bottom electrode doped by dopants of the same polarity as the dopants in the substrate, and the concentration of dopants in the substrate is equal to or greater than $1\times10^{18}/cm^3$, creating a current flow path through the substrate between the terminal portion of the bottom electrode and portions of the bottom electrode remote from said terminal portion.

This fabrication method makes it possible to reduce ESR in a horizontal capacitor structure without needing expensive advanced equipment to produce a dense network of vias.

In general, the bottom electrode of the electrode-insulator-electrode stack is formed by additional doping of a region of the substrate, and the overlying insulator and electrode layers of the capacitor stack are deposited conformally over a textured (contoured) surface of the bottom electrode.

The method may include configuring the capacitor structure to be mounted on a mounting substrate in an orientation wherein the surface at the first side of the substrate faces the mounting substrate, and formation of a metallization layer on the surface of the substrate remote from said surface at the first side (i.e. remote from the surface where the capacitive stack is provided). As a consequence, a still greater reduction in resistivity is achieved.

BRIEF DESCRIPTION OF THE DRAWINGS

Further features and advantages of the present invention will become apparent from the following description of certain embodiments thereof, given by way of illustration only, not limitation, with reference to the accompanying drawings in which:

FIG. 1 illustrates various horizontal 3D capacitor structures, in which.

FIG. 3 illustrates additional charge-flow paths that are formed in embodiments of the invention, in which.

DETAILED DESCRIPTION OF EXAMPLE EMBODIMENTS

A horizontal 3D capacitor component according to a first embodiment of the invention, and an example method for fabricating the component, will now be described with reference to FIGS. 2 and 3. In the illustrated example the capacitor component is implemented as a discrete capacitor component. However, in other embodiments of the invention the capacitive structure may be integrated with other components/devices formed in or on the same substrate.

Figure 1A:
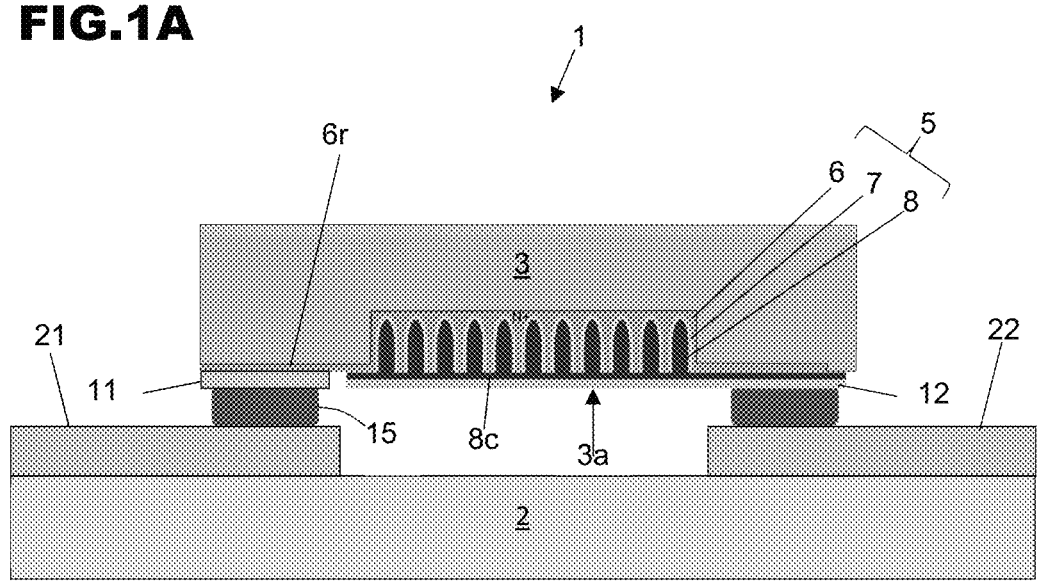
FIG. 1A represents a horizontal 3D capacitor structure having relatively high ESR.
Figure 1B:
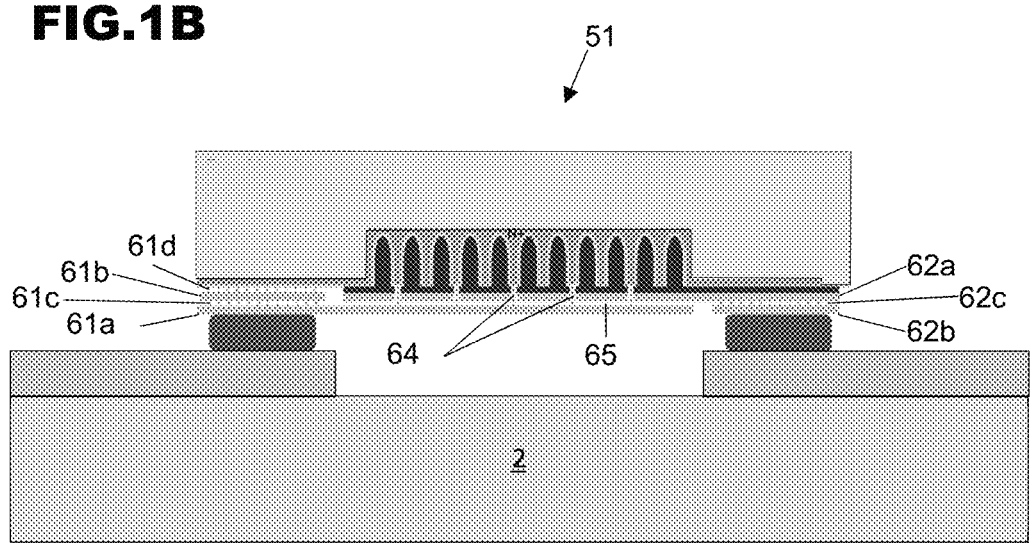
FIG. 1B represents a horizontal 3D capacitor structure in which ESR is reduced by formation of via-hole conductors connecting to the bottom electrode.

In the following description of FIGS. 2 and 3, the same reference numerals as those used in FIGS. 1A and 1B will be used to designate elements which may be the same as those used in the structures illustrated in FIGS. 1A and 1B, and detailed description of such elements is omitted.

Figure 2:
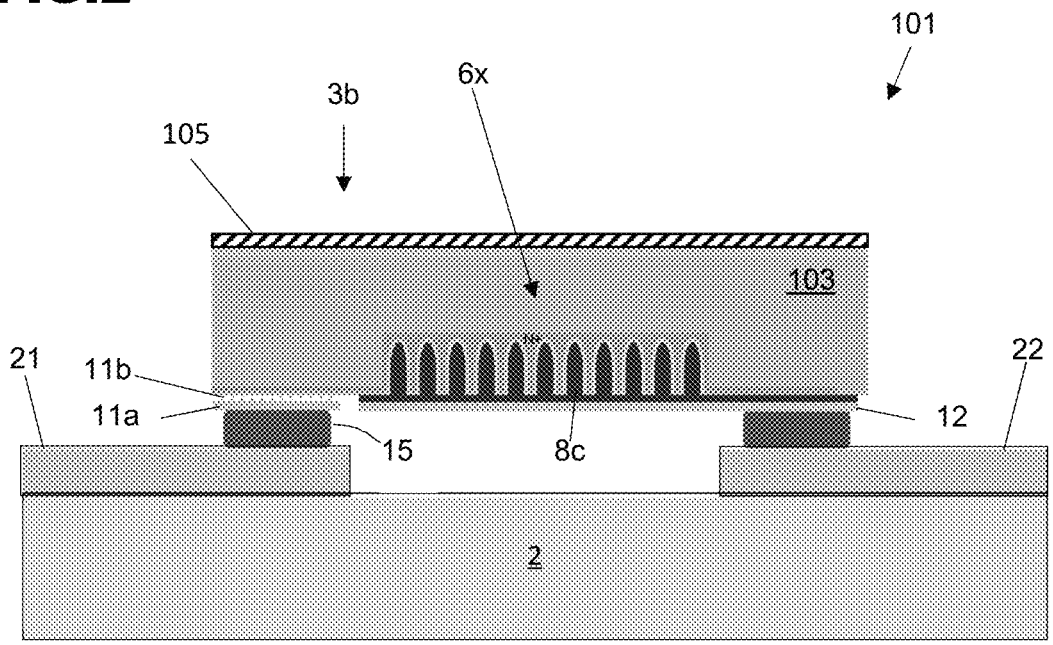
FIG. 2 is a diagram illustrating a horizontal capacitor structure according to a first embodiment of the invention.
Figure 3A:
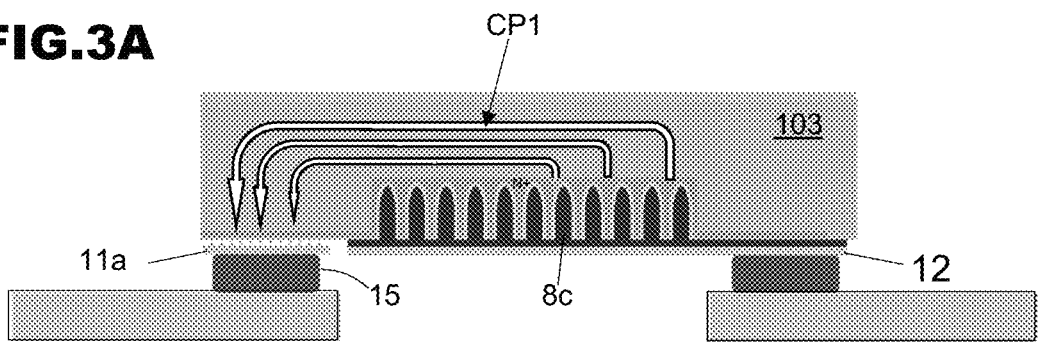
FIG. 3A illustrates a current path through the substrate.

As can be seen from FIG. 2, the capacitor component 101 comprises a substrate 103. In the example illustrated by FIGS. 2 and 3, the substrate 103 is a highly doped silicon substrate. In this example the doping of substrate 103 is $n^{++}$ type by any convenient dopants (e.g. phosphorus, antimony, arsenic). Typically the thickness of the substrate 2 is set in the range of from 20 μm to 400 μm, for example at 100 μm. The higher the doping of the substrate, the greater the reduction in ESR that may be obtained. Dopant levels of $1 \times 10^{18}/cm^3$ and above produce very good results, and dopant concentrations of the order of $1 \times 10^{19}/cm^3$ and above produce excellent results.

In this example, the bottom electrode 6 is formed by a region of the substrate 103, i.e. silicon in this example, which has been subjected to extra doping. The bottom electrode 6 is doped with dopants of the same polarity as the dopants in the substrate 103, i.e. in this example the bottom electrode 6 is also $n^{++}$ silicon. Typically, the bottom electrode 6 has a thickness of a few μm and the sheet resistance takes a value Rsq of a few ohms/square.

In the example illustrated in FIG. 2, the insulator layer 7 is made of $SiO_2$ and the top electrode layer 8 is made of polysilicon but, of course, other suitable materials may be used. So, for example, various materials may be used for insulator 7 including, but not limited to: SiN, $Al_2O_3$, high dielectric constant materials such as $HfO_2$, and stacks of different layers of dielectric materials, and various materials may be used for top electrode layer 8 including, but not limited to, TiN, Pt, Ru, etc. Although it may not be visible in FIG. 2, the insulator layer 7 is interposed between the bottom electrode 6 and the top electrode 8 not only in the region where the trenches are formed in the substrate but also in the regions where elongate portions of the bottom and top electrode layers overlie one another near the surface of the substrate. Typically, the resistivity of the polysilicon top electrode takes a value Rsq of a few ohms (per square).

In the example illustrated in FIG. 2, the major surface at the rear of the substrate 103 (i.e. the major surface at side 3b) is entirely covered by a metal layer 105 made of Al. The metal layer 105 may be made of various materials including, for example, materials (Ti, Pt/Au, Ag, etc.) that typically form backside metallization used for attaching dies to packages. However, in the present application the metallization 105 does not need to be used to connect the die to a mounting substrate and it is preferred to use materials, for example, Al, Cu, etc., whose sheet resistance is significantly lower than the sheet resistance of the substrate. In this way the metal layer 105 may significantly reduce the ESR of the overall capacitor structure, as described below.

The ESR-reduction effect of the metal layer 105 is greatest when the metal layer 105 covers the entirety of the surface of the substrate 2. However, a worthwhile reduction in ESR may still be obtained in a case where the metal layer 105 covers less than the whole of the surface, especially if the metal layer still covers a major part of the capacitor (when looked at in plan view).

In the example illustrated in FIG. 2 the contact structure connected to the bottom electrode 6 includes a plate portion 11a and via-hole conductors 11 b passing through an insulator layer (not shown) and interconnecting the terminal portion 6r of the bottom electrode to the plate portion 11a. In the example illustrated in FIG. 2 the contact structure connected to the top electrode 8 includes a plate 12 formed on the current collector portion 8c of the top electrode. However, the invention is not limited to use of contacts 11, 12 having the structures illustrated in FIG. 2; any convenient contact structure may be employed. For example, the contact 11 connected to the bottom electrode 6 may consist of a plate formed on the terminal portion 6r, and the contact connected to the top electrode may include parallel plate portions interconnected by via-hole conductors that pass through an insulating layer. Typically, the contacts may include metal layers that have a resistivity of the order of a few tens of milliohms.

The component 101 may be mounted on a mounting substrate 2, as illustrated in FIG. 2. Depending on the application, the mounting substrate may be, for example, a printed circuit board, or any other convenient support. The contact 11 connected to the bottom electrode of the capacitive stack and the contact 12 connected to the top of the capacitive stack may each be connected to a respective conductor 21, 22 on the mounting substrate 2, for instance using bonding bumps 15 as illustrated in FIG. 2; the bonding bumps may be made of known materials (e.g. solder, Cu, Au, Al, etc.). The invention is not limited to the use of bonding bumps, other connection techniques may be used, e.g. solder paste with stencil, etc. Although capacitive components according to the invention may be supplied ready-mounted on a mounting substrate as illustrated in FIG. 2, more generally they are supplied in an "unmounted" state, i.e. not attached to a mounting substrate. Optionally, while in the unmounted state the capacitive component can have the bonding bumps formed on the contacts 11, 12.

In the embodiment of the invention illustrated in FIG. 2, the overall ESR of the capacitive component 101 is reduced by virtue of the existence of reduced-resistivity paths that are provided between the terminal portion 6r of the bottom electrode 6 and other portions (indicated generally by 6x) of the layer 6 forming the bottom electrode layer. More specifically, as illustrated schematically in FIG. 3A, one or more reduced-resistivity paths CP1 are provided, through the substrate 103, between the terminal portion 6r of the bottom electrode and the rest of the layer 6 constituting the bottom electrode.

To put this into perspective it is useful to consider an example of parameter values that may be encountered in practice.

Nowadays it is often desired to produce thin discrete capacitor components and this requires use of thin layers in the capacitor structure, e.g. a bottom electrode 6 whose thickness is of the order of 2 μm. Even assuming that the concentration of dopants in the bottom electrode 6 is high, e.g. $1 \times 10^{19}/cm^3$ or higher (for instance, up to saturation level, in the case where current flows solely through the bottom electrode layer 6 (i.e. not through the substrate, for example because the substrate has doping of the opposite polarity to the bottom electrode 6) the sheet resistance of the bottom electrode 6 is a few Ohms per square. On the other hand, in a case—which shall be designated Example 1—where such a bottom electrode 6 is formed on a substrate 2 which is highly doped, namely of the order of $1 \times 10^{19}$-$2 \times 10^{19}$ dopants/$cm^3$, with dopants of the same polarity as the bottom electrode 6, and this substrate 2 is of the order of 100 μm thick, then the effective sheet resistance of the bottom electrode 6 drops by a factor of around 60. The resistance is affected as if the thickness of the bottom electrode 6 had been increased by the thickness of the substrate. The above example concerns a case in which the capacitor structure is formed in a substrate having length of around 200 μm and width of around 200 µm: the specific resistance values vary with the form factor of the substrate, but a reduction in resistance is obtained irrespective of the form factor.

Figure 3B:
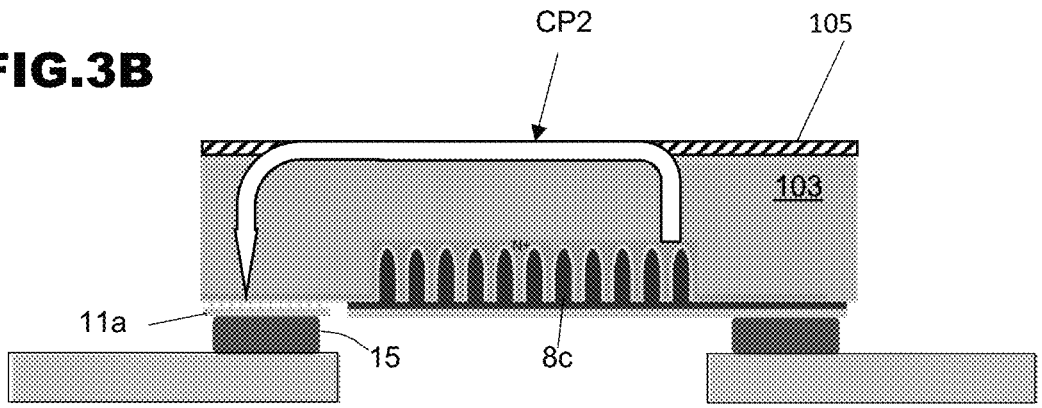
FIG. 3B illustrates a current path through a backside metallization layer and the substrate.

Furthermore, as illustrated schematically in FIG. 3B, in the case where a metal layer 105 is provided on the surface of the substrate opposite to the capacitive structure, an additional low-resistivity path CP2 is provided, through the substrate 103 along the metal layer 105 then back through the substrate, between the terminal portion 6r of the bottom electrode and the rest of the layer 6 constituting the bottom electrode.

A significant reduction in ESR is obtained by providing the metal layer 105 in combination with the highly-doped substrate 103 (i.e. a highly-doped substrate doped by dopants of the same polarity as the bottom electrode 6), allowing the current path CP2 to be formed. For instance, in the case where the structure described as Example 1 is provided with a 1 µm thick metal layer 105 made of Al formed all over the rear surface of the substrate 2 the sheet resistance drops to 20 mΩ/sq. It can be seen that the presence of the metal layer 105 has a large impact in reducing ESR. However, a reduction in ESR may still be obtained through use of the highly-doped substrate 103 even if the metallization layer 105 is not implemented (this latter case being illustrated in FIG. 3A).

Typically, the thickness of the rear metal layer 105 (when provided) is set in the range from 1 µm to 10 µm. The effectiveness of the resistance-reduction obtained via use of the rear metal layer 105 is reduced if that layer is extremely thin. Accordingly, it is preferred to set the thickness at 1 µm or greater. However, in general it is preferred to keep the thickness of the rear metal layer 105 no greater than about 10% of the overall component thickness.

An example implementation of a method for fabricating a capacitor component such as that of FIG. 2 will now be described with reference to the flow chart of FIG. 4.

Figure 4:
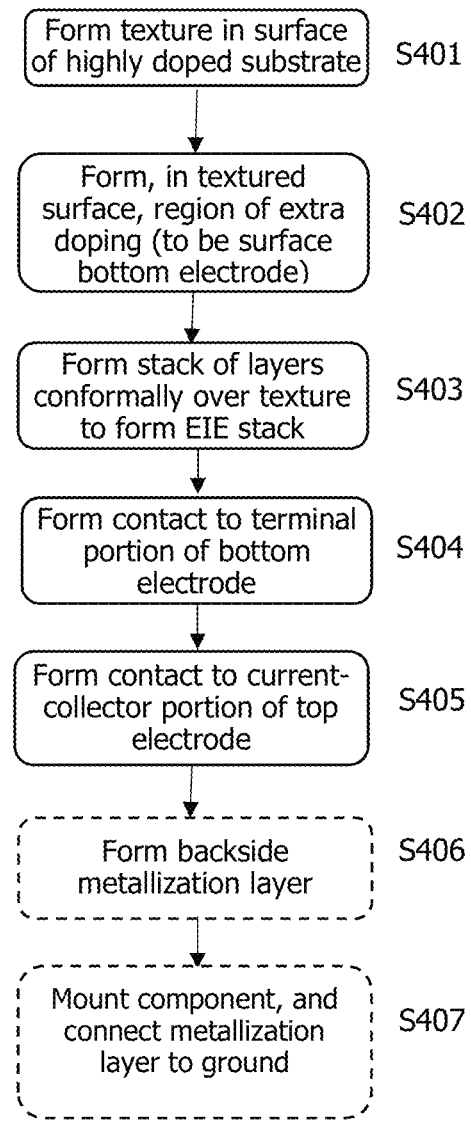
FIG. 4 is a flow diagram illustrating steps in an embodiment of a method of fabricating the capacitor structure of FIG. 2.

It is assumed that a suitably-prepared, highly-doped semiconductor substrate is provided at the start of the method illustrated by FIG. 4. This may be, for example, a low-ohmic (highly-doped) silicon wafer in which multiple discrete capacitive components according to the invention will be fabricated simultaneously and then separated later, for example by dicing. For simplicity, the following description only discusses formation of a single capacitive structure intended to be a discrete component.

Texture (e.g. holes, trenches or columns) is created in a surface of the substrate by any convenient technique (step S401). The texture may be created, for example, using masking and etching processes. Then, the textured surface is subjected to additional doping (S402), using dopants of the same polarity as those in the substrate, in the region where it is desired to have the bottom electrode 6, including the terminal portion 6r. Then the insulating layer 7 is deposited so as to conformally coat the textured surface, for example by chemical vapor deposition, atomic layer deposition, etc. Next, the conductive layer 8 is deposited over the insulating layer 7, for example by chemical vapor deposition process. The conductive material 8 may be deposited to conformally cover the insulating layer 7 and to extend in a layer (e.g. a thin film) 8c at the surface of the substrate. For example, the conductive material 8 may fill the holes that are lined by the insulating layer 7 and create a film or plate-shaped portion 8c at the surface of the substrate. These processes create an EIE stack constituted by the layers 6, 7 and 8 (S403).

A contact 11 is formed (S404) to the terminal portion 6r of the bottom electrode 6. This may involve deposition of a metal layer directly on the terminal portion of the bottom electrode, or formation of a structure including multiple point contacts (e.g. including insulating material, multiple via-hole conductors traversing the insulating material, and a plate portion), as in the example illustrated in FIG. 2.

A contact 12 is formed (S405) to the current-collector portion 8c of the top electrode 8. Generally this involves deposition of a metal layer directly on the current-collector portion of the top electrode as in the example illustrated in FIG. 2, but it may involve formation of a structure including multiple point contacts (e.g. including insulating material, multiple via-hole conductors traversing the insulating material, and one or more plate portions).

If desired, a rear metal layer 105 is formed on the surface of the substrate opposite to the surface upon which the contacts are formed (S406). Conventional processes may be used to create the rear metal layer 105.

The above-described process produces capacitive structures that have low ESR, without requiring complicated or costly procedures or equipment for production of a dense network of vias.

Figure 5:
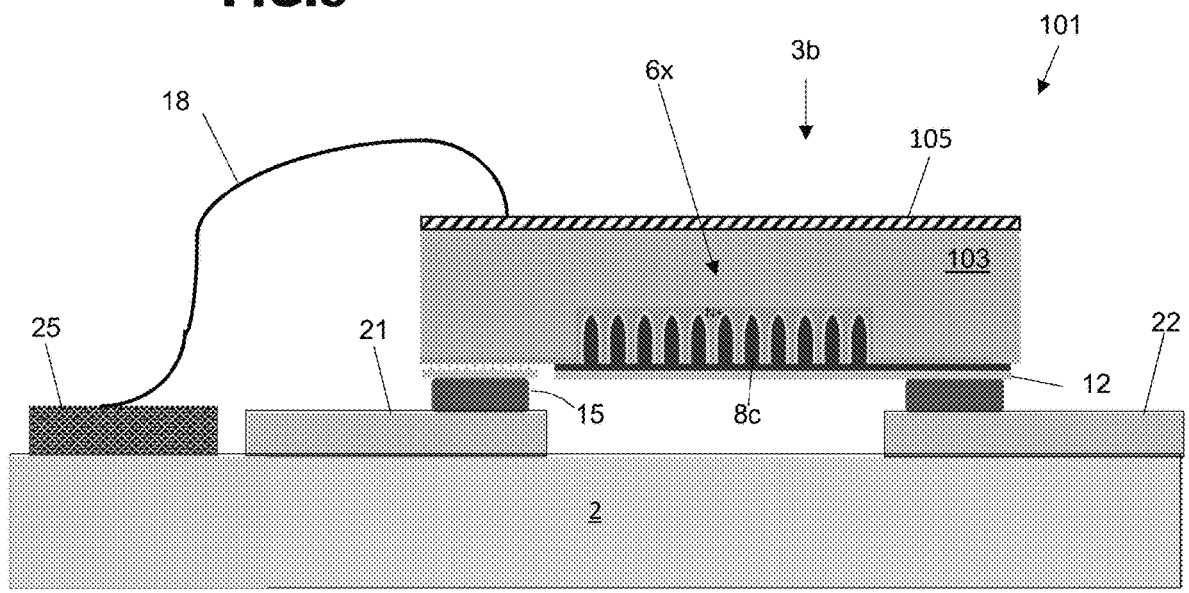
FIG. 5 illustrates a horizontal capacitor structure according to the first embodiment of the invention, mounted on a mounting substrate and having a connection to ground.

The capacitor component formed by the above-described process may be mounted on a mounting substrate by any convenient technique including, for example, bump bonding using bonding bumps 15 placed between the contacts 11 and 12 and corresponding conductors/pads 21, 22 of the mounting substrate. In a case where a rear metal layer 105 is present on the capacitive component, a shielding effect can be obtained by connecting the rear metal layer to ground (S407). The higher the percentage of the substrate that is covered by the rear metal layer 105, the greater the shielding effect that can be obtained. FIG. 5 illustrates a configuration in which the rear metal layer 105 is connected to a ground plane 25 in the mounting substrate using a bonding wire 18.

Additional Variants

Although the present invention has been described above with reference to certain specific embodiments, it will be understood that the invention is not limited by the particularities of the specific embodiments. Numerous variations, modifications and developments may be made in the above-described embodiments within the scope of the appended claims.

It is to be understood that references in this text to directions and locations, such as "top" and "bottom", merely refer to the directions that apply when architectures and components are oriented as illustrated in the accompanying drawings. Thus a surface which may be "top" in FIG. 1A would be closest to the ground if the component 1 were to be turned upside down from the illustrated orientation.

The invention claimed is:

1. A discrete capacitor component comprising:
   a substrate;
   a stack of layers formed, conformally, over a set of adjacent blind holes in the substrate, or over a set of adjacent columns provided on the substrate, to constitute an electrode-insulator-electrode stack, the electrode-insulator-electrode stack including a bottom electrode and a top electrode;
   wherein:
   the top electrode of the electrode-insulator-electrode stack has an elongate portion extending along the surface at a first side of the substrate, the first side of the substrate being the side where the mouths of the blind holes, or the tops of the columns, are formed, the bottom electrode of the electrode-insulator-electrode stack has a terminal portion extending along the surface at said first side of the substrate, and a contact connecting to the top electrode and a contact connecting to the bottom electrode are provided at said first side of the substrate;

wherein the substrate and the bottom electrode of the electrode-insulator-electrode stack are doped by dopants having the same polarity, and the concentration of dopants in the substrate is $1\times10^{18}/cm^3$ or greater, creating a current flow path through the substrate between the terminal portion of the bottom electrode and portions of the bottom electrode remote from said terminal portion;

and a metallization layer is on the surface of the substrate remote from said first surface, and the capacitor structure is configured to be mounted on a mounting substrate in an orientation wherein said surface at the first side of the substrate faces the mounting substrate.

2. The capacitor structure according to claim 1, wherein the substrate and bottom electrode have n-type doping.

3. The capacitor structure according to claim 1, wherein the electrode-insulator-electrode stack comprises a laminated structure including at least one intermediate electrode layer between the bottom electrode and top electrode layers, and insulating material interposed between adjacent electrode layers of the stack.

4. The capacitor structure according to claim 3, further comprising a set of via-hole conductors traversing the elongate portion of the top electrode, and a contact plate to connect an external circuit to an intermediate electrode of the stack, wherein the via-hole conductors connect multiple points on the intermediate electrode to said contact plate.

5. The capacitor structure according to claim 1, configured as a discrete component.

6. The capacitor structure according to claim 1, wherein the metallization layer consists of a layer of Al or Cu.

7. The capacitor structure according to claim 1, mounted on a mounting substrate in an orientation wherein said surface on the first side of the substrate faces the mounting substrate, wherein the metallization layer is connected to ground.

* * * * *